United States Patent [19]

Pathak et al.

[11] Patent Number: 5,027,320

[45] Date of Patent: Jun. 25, 1991

[54] EPROM CIRCUIT HAVING ENHANCED PROGRAMMABILITY AND IMPROVED SPEED AND RELIABILITY

[75] Inventors: Saroj Pathak, Los Altos Hills; Bruce Prickett, Fremont, both of Calif.

[73] Assignee: Cypress Semiconductor Corp., San Jose, Calif.

[21] Appl. No.: 410,951

[22] Filed: Sep. 22, 1989

[51] Int. Cl.[5] .............................................. G11C 7/00
[52] U.S. Cl. ................................. 365/185; 365/189.06
[58] Field of Search .................... 365/104, 185, 189.06

[56] References Cited

U.S. PATENT DOCUMENTS 4,710,900 12/1987 Higuchi ............................... 365/185

*Primary Examiner*—Joseph A. Popek
*Attorney, Agent, or Firm*—Blakely, Sokoloff, Taylor & Zafman

[57] ABSTRACT

The present invention relates to an MOS integrated circuit employing a plurality of floating gate type, erasable, programmable read-only memory (EPROM) devices. The improvement of the invention comprises a clamp coupled to the control gates of the EPROMs, the clamp being adapted to clamp the voltage on these gates in the range of the typical supply voltage for the circuit, whereby, after an EPROM cell is properly charged, it will continue to read out as a properly charged cell even though some of the actual charge on its floating gate may have leaked.

4 Claims, 1 Drawing Sheet

EPROM CIRCUIT HAVING ENHANCED PROGRAMMABILITY AND IMPROVED SPEED AND RELIABILITY

BACKGROUND AND FIELD OF THE INVENTION

Erasable programmable read only memory (EPROM) arrays and electrically erasable programmable read only memory ($E^2$PROM) arrays are in common usage, particularly in microprocessor applications. Another use of EPROM and $E^2$PROM memory cells is in logic arrays, wherein the programmable cell is used to reconfigure the logic on the array. These arrays are called programmable logic devices (PLDs) or programmable logic arrays (PLAs).

As is conventional, these programmable devices are programmed electrically by applying a relatively high programming voltage which operates to place a charge on the floating gate of the EPROM or $E^2$PROM cell. Typically the programmable element or cell is programmed to a non-conducting state when the floating gate is charged. Depending on the logic design, however, this charged, non-conducting state can represent a logic ONE or a logic ZERO. Usually it represents a ONE. An uncharged, conducting cell usually represents a logic ZERO. The logic state of a programmed cell (either charged or uncharged) is read by pulling the control gate of the floating gate device to a high voltage, usually the supply voltage, which typically is 5 volts, causing current to flow from the drain to the source. This drain-source current through the floating gate MOS transistor is then monitored using sense amplifiers to determine, by the amount of this drain-source current, whether the floating gate is charged or not, representing a logic ONE or a logic ZERO, respectively.

In order to sense a ZERO, represented by an uncharged floating gate, the array must be designed so that the erased threshold voltage on the gate of the MOS device will be low enough to cause enough current to flow to be sensed as a ZERO. When no current flows through the device, or too little current, it will be sensed to be in the logically OFF state (which, for the purposes of further discussion, will be assumed to represent a logic ONE). As long as the control gate voltage remains higher than the erased threshold, current will flow, and the programmable element will be in the logic ON state which represents a logic ZERO.

As the performance of EPROM memory arrays and PLDs has been improved over the years, the sensing speed—the speed at which these elements are read—has become very critical. To maximize this reading speed, it is necessary to apply the full 5 volt supply voltage to the gate of the element. However, as is well known, supply voltages tend to vary somewhat. If the threshold voltage to which the floating gate device is programmed is not higher than the maximum possible supply voltage, a charged programmable element will have some leakage of current through the floating gate and thus will not be turned OFF completely, causing it to read a ZERO rather than a ONE. This causes improper functioning of the device.

Furthermore, once programmed, these floating gate cells often must remain programmed for long periods up to five or ten years. Aging of the memory element with time, temperature or continuous read cycling may cause the device to lose some of its charge which had been placed upon the floating gate during programming. Such charge leakage causes the programmed threshold to drop. If the programmed threshold drops below the maximum supply voltage, an element which had been programmed to be OFF (a logic ONE) will turn on, showing up as a logic ZERO and thus causing a reliability failure.

Another problem has showed up in new generation EPROM technologies where read speed is optimized. Older EPROM devices had an access time (the time required to read the signal on the floating gate) of about 100 nanoseconds. Newer devices have dropped this time to as low as 20 nanoseconds. The maximum programming voltages, and hence the programmed device thresholds, are both getting lower to improve the speed. Yet it is still necessary to apply the full power supply voltage to the gate of the programmable element during a read operation to maintain reading speed. The programming margin, a measure of reliability, is the difference between the maximum programmed threshold voltage and the supply voltage. Accordingly, during a read operation, the margin between the voltages which cause the two logic states (ON and OFF) is narrowing, causing yield, reliability and programmability difficulties.

When EPROM cells are designed, the read speed is increased by raising the read current. The higher the read current, the faster the device is read. In the design of these cells for faster reading, lower channel implant dosages are used, along with shallower junctions, in order to produce these higher read currents. These designs, however, produce a lower cell programmed threshold. That means the cell is not optimized for programming reliability, but instead, for reading. Using such optimization techniques, the resultant programmed threshold voltage is no longer 7 volts, as was previously used, but is much closer to the supply voltage, 5 volts. Optimally, the programmed threshold should be 7 volts for reliability. In prior devices, where you didn't need as high a read current, it was relatively simple to optimize the programmed threshold at 7 volts. In the newer devices, this is not possible.

As the programmed threshold drops, the yield of good devices also drops because an insufficient programmed threshold will show up as a read error during final test. Moreover, even if the devices do get by final test, even small amounts of charge leaking off the floating gate during reliability testing will show up as a reliability failure because the margin between the programmed threshold and the supply is so small. This results in a data retention error, which can only be prevented by extended margin screening at higher than normal voltages, a costly procedure.

BRIEF DESCRIPTION OF THE INVENTION

This invention provides a memory array or PLD made up of a plurality of floating gate, erasable, programmable read-only memories which may be operated using a high read current, yet which are capable of being manufactured at high yields and high reliability. Briefly, the MOS integrated circuit of the invention uses a plurality of floating gate-type erasable, programmable read-only memory devices. The improvement of the invention comprises the use of a clamp coupled to the control gates of the memory devices adapted to clamp the voltage on the control gates in the range of the typical supply voltage for the circuit, whereby, after a cell is properly charged, it will continue to read out as a properly charged cell even though some of the actual charge on its floating gate may have leaked. Furthermore, correct cell readout will continue to be obtained even during the application of read voltages in excess of the typical supply voltage.

For example, assume the floating gate of a prior art cell were charged during programming, and that the programmed threshold of the device was 7 volts. The cell will continue to read a ONE (charged) until the voltage on the control gate goes above 7 volts, at which time it will become conductive and read a ZERO (error). In the cell of the invention, if the typical supply voltage is 5 volts, and if the device is stressed during reliability testing, as is usually the case, by applying a greater voltage, for example 7 volts, even if the cell was insufficiently charged or had lost some charge, it will not show up as a read error because the clamp of the invention maintains the control gate of the cell at the required 5 volt level. Therefore the cell will not become conductive and will continue to read a ONE. Using a clamp voltage equal to the typical supply voltage, for example 5 volts, in a stress test where 7 volts is applied, there is still a 2 volt margin before current will flow and an error shows up. This was not the case with prior art devices without the control gate clamping technique of this invention. Use of the invention still permits the use of manufacturing reliability screens, since the control gate voltage can be raised above the clamp voltage by using separate programming or margin screen circuits which are well known in the art.

Clamps had been used in EPROM circuits before. However, they were used for clamping the drain of an EPROM cell, not the gate, for the purpose of improving sensing speed. Clamping the drain shortens the swing on the bitline connected to the drains of the storage cells, enabling them to switch from ON to OFF and back faster. The drains are high capacitance nodes because there are many device drains connected to a single bitline. Therefore shortening the swing by clamping the drains increases the sensing speed because the bitline does not have to swing over as large a voltage range. This clamping technique is described in U.S. Pat. No. 4,223,394.

Even though drain clamps had been used in EPROM arrays for switching speed enhancement, clamping the control gate was not expected to improve reading speed, in fact, was expected to reduce reading speed. Since the gate voltage on the cell determines the cell current, the higher the gate voltage, the higher the cell current. A higher cell current slows switching. Therefore it was previously thought that a clamp, which would lower the gate voltage and cell current, would actually reduce reading speed.

According to this invention, it was discovered that you could apply a clamp to the control gate of an EPROM cell which tracks the supply voltage, but only up to the typical level of 5 volts, and then clamps it. It is still necessary to have the full 5 volts at the control gate as the voltage raises to 5 volts in order not to reduce the device speed, but above 5 volts, the clamp of the invention is necessary to improve reliability. Therefore the clamp of the invention allows tracking up to 5 volts, and then maintains the control gate voltage at that level.

In the devices of the invention, the programming threshold voltage of the EPROM cells is affected by many factors, such as variations in manufacturing processing conditions, temperature, device age and number of read cycles. In spite of these variations, the circuit of the invention clamps the EPROM control gate voltage at a predetermined precise level which is determined by the sensing voltage and the programming threshold of the EPROM cells. This not only renders the array insensitive to these above-mentioned factors, but also to variations in the applied supply voltage itself.

The device of the invention is designed so that the cell control gate voltage tracks the supply voltage for low voltages (where read speed is critical) and then is clamped at a predetermined maximum level where higher stress supply voltages are applied during reliability testing. If the EPROM cell has not been programmed up to the full supply level, or if some of the charge has leaked away, the clamp on the control gate will ensure that a charged EPROM cell will remain OFF as long as the clamping voltage remains lower than the programmed threshold. By carefully selecting this programmed threshold voltage, device reliability can be greatly enhanced while avoiding the read speed reduction experienced with prior art devices. It is also possible to make the value of this clamping voltage track manufacturing process variations, providing higher device yield in spite of such variations. The invention is applicable to arrays of EPROMs, both ultraviolet and flash erasable, as well as E²PROMs, PLAs and PLDs.

DETAILED DESCRIPTION OF THE PREFERRED EMBODIMENT

Figure 1:
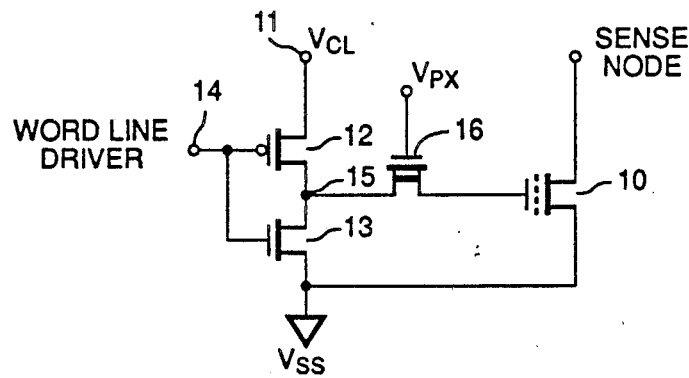
FIG. 1 is a schematic circuit diagram of one embodiment of the invention.

The circuit of FIG. 1 is used to provide a clamping voltage on the gate of erasable programmable read-only memory (EPROM) 10. EPROM cell 10 is a representative EPROM cell in an array of EPROM cells used in a memory array. In such arrays, only a single EPROM cell is read or sensed at one time. Accordingly, the capacitance on its gate at any time is small. In order to provide a clamping voltage on the gate of EPROM cell 10, a source of clamping voltage $V_{cl}$ is coupled to terminal 11, which in turn is coupled to the source of P-channel enhancement mode MOS transistor 12. The drain of transistor 12 is coupled to the drain of N-channel enhancement mode MOS transistor 13, whose source is connected to ground, as shown. P-channel transistor 12 and N-channel transistor 13 make up a complimentary MOS (CMOS) transistor pair. These CMOS pairs serve to select and deselect the memory cell 10. The drains of transistors 12 and 13 are coupled at node 15. The clamping voltage $V_{cl}$ limits the high voltage output at node 15 of CMOS transistors 12 and 13. Node 15 is coupled through an N-channel depletion mode passgate transistor 16 to the gate of EPROM 10. Transistor 16 is controlled by $V_{px}$ at its gate. $V_{px}$ is control voltage which is high during read, rendering transistor 16 conductive and placing the clamping voltage $V_{cl}$ onto the gate of EPROM 10. When the cell is being programmed, however, or being tested for margin voltage, $V_{px}$ is low, turning off transistor 16 and removing the clamping voltage from the gate of EPROM 10. A high voltage can then be applied to the control gate through separate high voltage circuits well known in the art. The gates of transistors 12 and 13 are connected together, and in turn are connected to the word line driver circuitry, not shown. When EPROM 10 has been selected for sensing (or programming), a signal will appear at word line driver terminal 14.

The clamping voltage $V_{cl}$ at node 15, coupled to the control gate of EPROM cell 10 through transistor 16, limits that gate voltage to $V_{cl}$, typically 5 volts. This insures that if the cell has been programmed OFF by charging its floating gate, it will stay OFF, even if some charge subsequently leaks from its floating gate. This circuit has the advantage that the programmed threshold designed into the cell may be only slightly higher than the clamping voltage of 5 volts and yet still result in reliable and stable programming. In prior art cells, the programmed threshold had to be at least 6 ½ volts, preferably 7 volts, in order to provide a sufficient programming margin to protect against changes in the values read caused by processing and temperature variations, by increases in $V_{cc}$ or by charge leakage. This less stringent programmed threshold requirement permits better device performance at high read currents, higher yield in manufacturing and improved reliability.

During repeated read cycles of the EPROM cell 10, where charge is stored on the cell in order to read a ONE, the stored charge on the floating gate can slowly leak away, which, without the clamp of this invention, would cause a read error unless the programmed threshold was very large and provided sufficient programmed margin so that the cell could tolerate such leakage. However, using the clamping circuit shown in FIG. 1, the programmed threshold can be reduced, because the clamp limits the control gate voltage to the typical supply voltage, allowing the programmed threshold to fall below the maximum supply voltage without causing a reliability failure. Therefore the programmed threshold may be only slightly higher than 5 volts instead of the usual 7 volts, hence decreasing the required programmed margin by at least 1.5 volts while not decreasing the reliability of the device.

Figure 2:
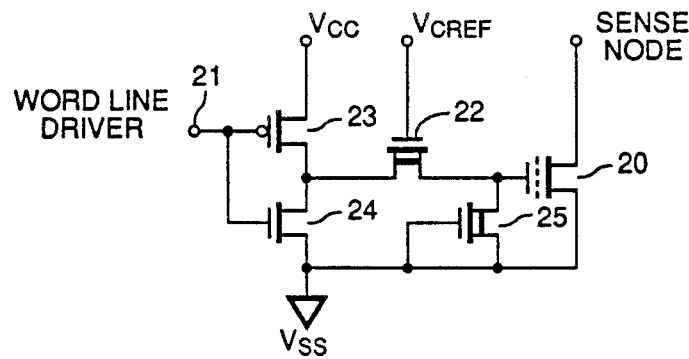
FIG. 2 is a schematic circuit diagram of another embodiment of the invention.

The circuit shown in FIG. 2 rather than the circuit of FIG. 1 is useful where a number of EPROMs 20 may be connected in parallel and read at the same time. For example, in PLDs, multiple input terms require that multiple EPROMs have their word lines selected at the same time for reading. Thus the "sense node" of the circuit is connected in parallel with other EPROM cells that also have their control gates raised to a high voltage, often with more than one cell drawing current at the same time. For this reason, the operation of an array of PLDs is very sensitive to programming margin because the leakage current from many cells can combine to cause a failure, while in the operation of an array of EPROM cells, only one cell is selected on a bit line at a time. A second consideration with PLDs is that many input terms may be switching at the same time, requiring large amounts of transient current to charge the control gates of the EPROM cells to the high select voltage. If the circuit of FIG. 1 were used in a PLD, the combined capacitance of multiple input terms would discharge the clamping voltage node $V_{cl}$ during a transition, lowering $V_{cl}$ and slowing down the pull-up of the input terms. This can be avoided by using a very large decoupling capacitor on clamping node $V_{cl}$, but such a capacitor may be impractical in large PLD arrays.

To overcome this problem, the clamping voltage $V_{cref}$, as shown in FIG. 2, is applied to the gate of depletion mode transistor 22 rather than at the source of P-channel enhancement mode transistor 23, as was done in the circuit of FIG. 1. Therefore the capacitance of the gate of EPROM cell 20 does not load node $V_{cref}$ directly. It is understood that an N-channel depletion mode transistor 22 is used in the preferred embodiment, but other types of transistors, such as enhancement mode transistors, may also be employed with appropriate adjustments known in the art.

The CMOS transistor pair comprised of transistors 23 and 24 in FIG. 2 operate in the same manner as transistors 12 and 13 described earlier in connection with FIG. 1, except that $V_{cc}$, the supply voltage, is applied to the drain of P-channel transistor 23 rather than the clamping voltage $V_{cl}$. With these exceptions the circuit of FIG. 2 operates in the same manner as the circuit of FIG. 1. Furthermore, "leaker" transistor 25, an N-channel enhancement mode device, is used to leak charge from the gate of EPROM 20 in the event of noise spikes, thus improving stability.

The circuit in FIG. 2 demonstrates the normal operating mode of the clamp for PLDs. However, to apply a high voltage to the control gate of EPROM cell 20 during programming, a separate high voltage supply circuit is used which is well known in the art. To prevent the clamp circuit from drawing current from such a high voltage circuit during programming, the connections of transistors 22 and 25 are modified. Accordingly, the gate of transistor 22, which is connected to $V_{cref}$ during normal operation, is connected to $V_{ss}$ during programming. The source of leaker transistor 25 also is switched from $V_{ss}$, where it is connected during normal operation, to $V_{cc}$ during programming. The gate of leaker transistor 25 remains at $V_{ss}$. By switching these connections when a high voltage is applied to the control gates of the EPROM cells, transistors 22 and 25 are prevented from drawing current from the high voltage circuit, yet may still perform their clamping function during normal operation.

Figure 3:
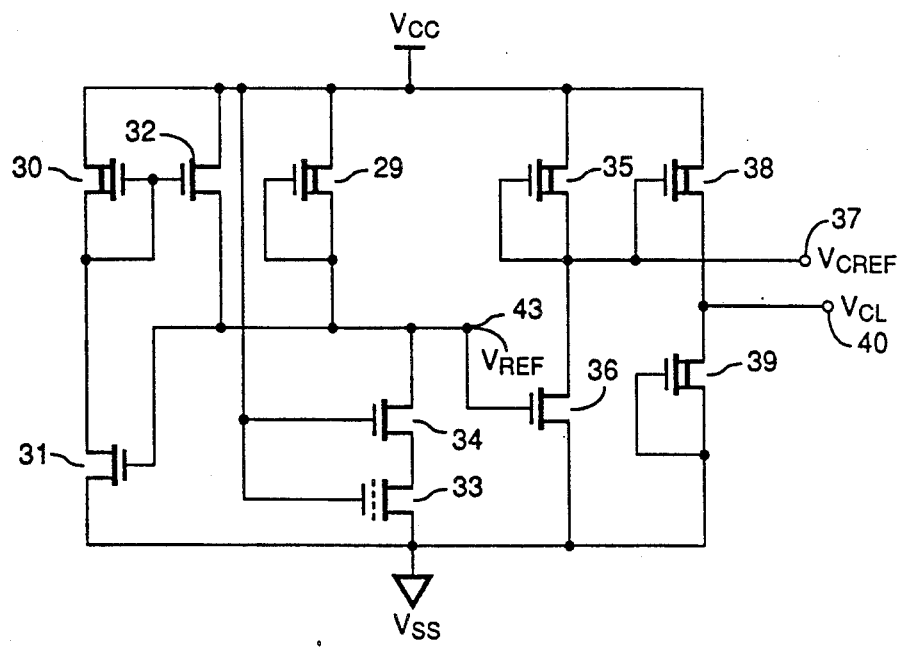
FIG. 3 is a schematic circuit diagram of the clamping voltage generator used to generate the clamping voltages of the invention.

Referring to FIG. 3, a preferred embodiment of the circuit used to generate the clamping voltages used in the circuits of the invention shown in FIGS. 1 and 2 is shown. The output voltages $V_{cref}$ and $V_{cl}$ are generated in stages. The first stage, employing N-channel depletion mode transistor 30, N-channel enhancement mode transistor 31 and N-channel enhancement mode transistor 32, generates an output voltage shown at node 43 called $V_{ref}$. When the circuit is energized, once $V_{cc}$ rises above about 4.5 volts, $V_{ref}$ is maintained at a fixed voltage which is near to an NMOS threshold voltage.

Floating gate transistor 33 and passgate N-channel enhancement mode transistor 34 mimic the corresponding circuitry in the PLD or EPROM array. N-channel depletion mode transistor 29 mimics the pull-up transistor in the array sense amplifiers. These three devices provide compensation in the reference and clamping voltage generator of FIG. 3 for variations in temperature and manufacturing processing conditions, since these devices are formed in the same process and will operate at the same temperature as the comparable transistors in the array. Such compensation schemes for EPROM circuitry are described in U.S. Pat. No. 4,851,720 assigned to the same assignee as this invention.

$V_{ref}$ at node 43 is fed into the gate of N-channel enhancement mode transistor 36, which is part of a depletion inverter which includes N-channel depletion mode transistor 35. The output of this depletion inverter circuit appears at node 37 and has been called $V_{cref}$. $V_{cref}$ is also fed into the gate of N-channel depletion mode transistor 38, which outputs clamping voltage $V_{cl}$ from its source terminal 40. The drain of transistor 38 is connected to $V_{cc}$. Transistor 39 is called a "leaker" transistor which stabilizes clamping voltage $V_{cl}$. Transistor 39 is not absolutely necessary for clamping, but if there is a noise spike on the line, it serves to leak the excess charge, improving stability of the device.

It is necessary that transistor 38 be a depletion mode device so that $V_{cl}$ can be shifted up by one depletion threshold above the voltage $V_{cref}$, which is fixed at about 3 to 3.5 volts. For supply voltages below $V_{cref}$ plus one threshold voltage $V_{td}$, $V_{cl}$ is pulled up to the supply voltage. When the supply voltage exceeds $V_{cref}+V_{td}$, the depletion device 38 limits $V_{cl}$ to $V_{cref}+V_{td}$. It is important for proper clamping that neither $V_{cref}$, on the gate of transistor 35, nor the depletion threshold of transistor 38, is supply-dependent, so that the clamping voltage $V_{cl}$ or $V_{cref}$ remains independent of the supply. When the circuit of FIG. 3 is used to supply a clamping voltage to the word line driver circuit of FIG. 2, transistors 38 and 39 are not used, since their equivalents are already present as transistors 22 and 25, respectively, in the circuit of FIG. 2. $V_{cl}$ is not needed since $V_{cref}$ is converted into $V_{cl}$ by the depletion threshold drop of depletion mode transistor 22 shown in FIG. 2. Similarly, $V_{cref}$ is generated but not used by the word line driver when the circuit of FIG. 3 is used with the word line driver circuit of FIG. 1, since the clamping voltage $V_{cl}$ is generated directly by the circuit of FIG. 3.

The above description and drawings describe and show a preferred embodiment. Many modifications may be made without departing from the spirit and scope of the invention, which is limited only by the claims which follow.

We claim:

1. In an MOS integrated circuit having a plurality of floating gate type erasable, programmable read-only memory devices, the improvement comprising a clamping means coupled to the control gates of said memory devices, said clamping means being adapted, as said memory device is being charged to a predetermined voltage by the application of a voltage to its control gates, to clamp the resulting voltage on said control gates below the maximum supply voltage for said circuit, whereby, after said memory device has been properly charged, during a read operation said memory device will continue to read out as a properly charged memory device even though some of the actual charge on its floating gate subsequently may have leaked.

2. The improvement in the floating gate memory circuit of claim 1 further characterized by said clamping voltage being applied to the control gate of said memory device through a passgate transistor.

3. The improvement in the floating gate memory circuit of claim 2 further characterized by said passgate transistor being a depletion mode device.

4. The improvement in the floating gate memory circuit of claim 1 further characterized by the voltage on said clamping means being taken from a node on said integrated circuit the voltage on which varies proportionally to the threshold voltage and current of the other transistors on the integrated circuit in accordance with processing and temperature variations.

* * * * *